United States Patent [19]
Kato et al.

[11] Patent Number: 5,727,954
[45] Date of Patent: Mar. 17, 1998

[54] CONNECTOR HAVING RELATIVELY MOVABLE UPPER AND LOWER TERMINALS

[75] Inventors: Yuji Kato, Yokohama; Nanahiro Hayakawa, Tokyo, both of Japan

[73] Assignee: Yamaichi Electronics Co., Ltd., Tokyo, Japan

[21] Appl. No.: 599,341

[22] Filed: Feb. 8, 1996

[30] Foreign Application Priority Data

Feb. 8, 1995 [JP] Japan .................. 7-044885

[51] Int. Cl.⁶ ...................................... H01R 9/09
[52] U.S. Cl. ........................................ 439/66
[58] Field of Search ................. 439/66, 71, 70, 439/591

[56] References Cited

U.S. PATENT DOCUMENTS

| | | | |
|---|---|---|---|
| 4,508,405 | 4/1985 | Damon et al. | 439/66 |
| 5,388,997 | 2/1995 | Grange et al. | 439/591 |
| 5,395,254 | 3/1995 | Mogi | 439/71 |

FOREIGN PATENT DOCUMENTS 3-127789  12/1991  Japan .

*Primary Examiner*—Neil Abrams
*Assistant Examiner*—Barry M. L. Standig
*Attorney, Agent, or Firm*—Wenderoth, Lind & Ponack

[57] ABSTRACT

A connector includes a contact pin having an upper pin terminal and a lower pin terminal interposed between an upper connection object such as an IC or the like and a wiring substrate serving as a lower connection object so as to be brought into contact under pressure with contact pieces arranged on surfaces of the objects. The contact pin is held in a hole such that the contact pin as a whole can be moved upwardly and downwardly a predetermined stroke independent of resilient upward and downward movement of the individual upper and lower pin terminals. An upper movement preventive element and a lower movement preventive element, for establishing the upward and downward strokes, are formed between the contact pin and a wall of the hole. When the lower pin terminal is brought into abutment with the wiring substrate serving as the lower connection object, the overall contact pin is freely moved upwardly within the hole so as to engage the upward movement preventive element. After the completion of the engagement with the upward movement preventive element, only the lower pin terminal is push upwardly against the bias of the spring. When the upper connection object is brought into abutment with the upper pin terminal, only the upper pin terminal is descended while compressing the spring, thereby attaining electrical contact under pressure.

12 Claims, 8 Drawing Sheets

5,727,954

1

CONNECTOR HAVING RELATIVELY MOVABLE UPPER AND LOWER TERMINALS

BACKGROUND OF THE INVENTION

This invention relates to a connector in which a lower pin terminal of a contact pin is brought into abutment with a corresponding one of plural contact pieces arranged on the surface of a wiring circuit substrate so as to be contacted under pressure with the same, and an upper pin terminal of the contact pin is abutted by a corresponding one of the contact pieces arranged on the surface of an IC so as to achieve a pressure contact therebetween.

PRIOR ART

Connectors of this type, which have heretofore been widely utilized are constructed, as shown for example in FIG. 4 of Japanese Utility Model Application Laid-Open No. 127789/91, such that a sleeve is press-fitted into the interior of a hole an insulative substrate. This sleeve is provided with an upper pin terminal and a lower pin terminal such that the upper and lower pin terminals can move upwardly and downwardly. The upper and lower pin terminals are resiliently retained by a coil spring loaded in the sleeve and interposed between the upper and lower pin terminals. This connector is interposed between wiring substrates. The upper and lower pin terminals are pressed from mutually different directions to thereby compress the spring, and a pressure contact force is obtained by the biasing force of the spring with respect to the opposing wiring substrates.

The coil spring type contact pins mentioned above are effective for expanding and contracting the upper and lower pin terminals on an axis. However, the above-mentioned prior art has such shortcomings that the contact pin comprises four different parts such as a sleeve, an upper and a lower terminal, and a coil spring, and in addition, the contact pressure tends to become non-uniform due to irregular press-fit accuracy with respect to the insulated substrate. Especially, when the lower pin terminal of the connector is brought into abutment with the wiring substrate for mounting, complicated and troublesome operations are required, such as firmly securing the connector to the wiring substrate by machine screws against a large load (biasing force) caused by the coil spring. After the completion of the securing process with the use of machine screws (after the mounting process), a large biasing force caused by the coil spring is normally applied to the wiring substrate irrespective of the presence or absence of pressure contact of the upper object part with respect to the upper pin terminal, thus resulting in various problems such as warping or turning up of the thin wiring substrate, decrease in contact pressure of the lower pin terminal due to warping, cracks of the substrate, and the like.

Furthermore, the above-mentioned prior art not only requires such highly complicated assembly work as press fitting the individual contact pins into the insulative substrate, but also it involves such problems as deformation of the contact pins at the time of press-fitting, cracking of the hole wall, inferior press-fitting, and the like. Since the contact pins cannot be exchanged, even a single inferior pin can cause the whole socket to be wasted. This is economically inefficient, indeed.

SUMMARY OF THE INVENTION

The present invention intends to provide a connector capable of obviating the above-mentioned problems. This connector uses, as in the prior art, a contact pin having a spring interposed between an upper pin terminal and a lower pin terminal so that the upper and lower pin terminals can be resiliently moved upwardly and downwardly. The entire contact pin having the upper and lower pin terminals is retained under a resilient condition due to the spring such that the entire contact pin can move a predetermined stroke upwardly and downwardly with respect to the insulative substrate.

In other words, the contact pin is held in the hole such that, independent of the resilient upward and downward movements of the individual upper and lower pin terminals, the entire contact pin can freely move a predetermined stroke upwardly and downwardly with respect to the insulative substrate. Then, an upward movement preventive element and a downward movement preventive element for establishing the upward and downward stroke are formed between this contact pin and the hole wall so that the lower position of the contact pin is maintained by the downward movement preventive element. When the lower pin terminal is brought into abutment with the wiring substrate as a lower connection object, the entire contact pin freely moves upwardly and downwardly within the hole and comes into engagement with the upward movement preventive element. After this engagement with the upward movement preventive element, only the lower pin terminal is caused to move upwardly while compressing the spring. When the upper connection object is brought into abutment with the upper pin terminal, only the upper pin terminal is caused to move downwardly while compressing the spring, thereby achieving the respective pressure contact.

DETAILED DESCRIPTION OF THE INVENTION

Figure 1:
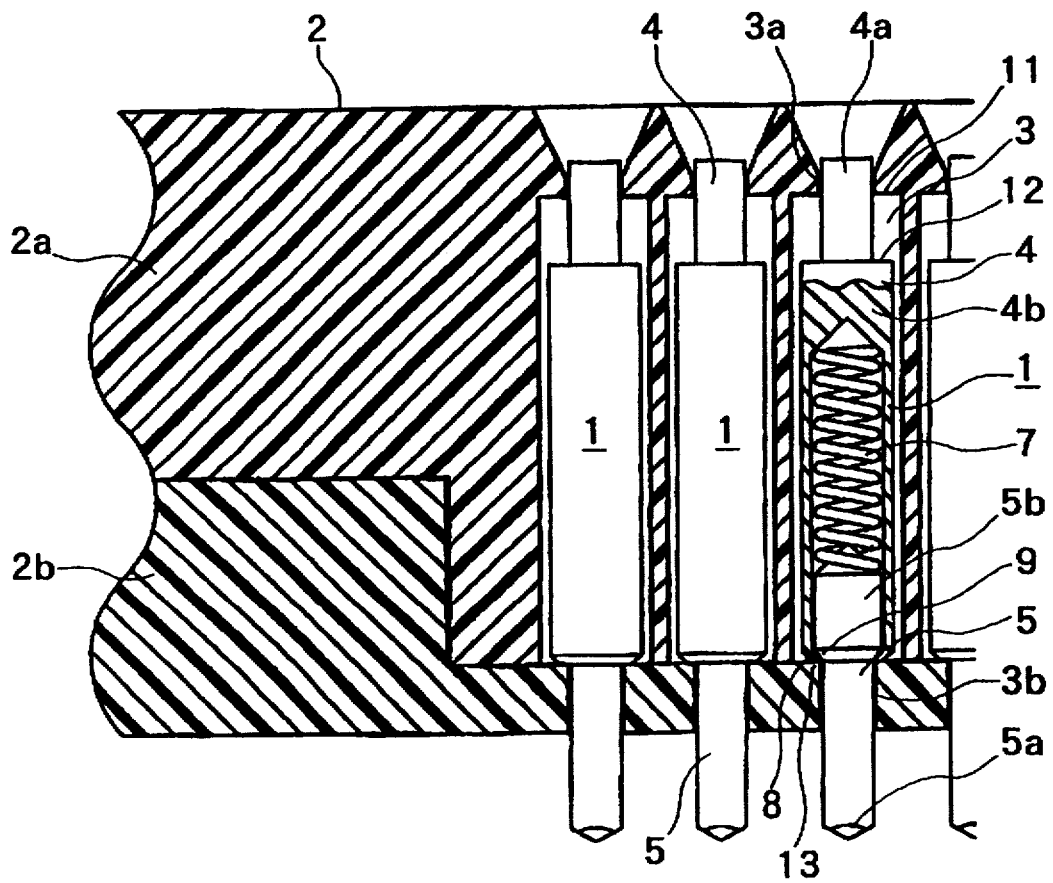
FIG. 1 is a sectional view of a main part of a connector showing one embodiment of the present invention.

One embodiment of the present invention will now be described with reference to the drawings.

First Embodiment (FIGS. 1 through 5 and FIG. 8)

A contact pin 1 is held within a hole 3 of an insulative substrate 2. Opposing ends of the contact pin 1 are provided respectively with a cylindrical upper pin terminal 4 and a cylindrical lower pin terminal 5 to which pressure contact forces are applied in opposite directions, respectively, by connection objects.

The upper pin terminal 4 and lower pin terminal 5 can be moved in a contracting direction against a spring 7 while compressing the spring 7, and in an expanding direction by reaction of the spring 7. The entire contact pin 1 can be freely moved a predetermined stroke upwardly and downwardly within the hole 3 with respect to the insulative substrate 2.

Specifically, the contact pin 1 has the upper pin terminal 4 and the lower pin terminal 5. The upper pin terminal 4 has an enlarged diameter cylindrical sleeve 4b integrally connected to a basal portion (lower end) of a reduced diameter portion 4a In other words, the contact pin 1 has the reduced diameter pin terminal portion 4a integrally connected to an upper end of the enlarged diameter sleeve 4b, and the lower pin terminal 5 separately situated with respect to the upper pin terminal 4 and fitted to the interior of a lower opening portion of the sleeve 4b for movement upwardly and downwardly. The lower pin terminal 5 and the upper pin terminal 4 are resiliently retained by the load of the spring 7 within the sleeve 4b, such that the upper and lower pin terminals 4 and 5 are resiliently connected with each other. That is, the spring 7 is interposed between the upper and lower pin terminals 4 and 5 so that the terminals 4 and 5 are resiliently connected with each other while being resiliently retained by the spring 7.

The upper and lower terminals 4 and 5 are concentrically arranged with respect to each other. The lower pin terminal 5 is provided at a basal portion (upper end) thereof with a fitting portion 5b having an enlarged diameter cylindrical configuration and a reduced diameter cylindrical pin terminal portion 5a connected to a lower end of this fitting portion 5b. The fitting portion 5b is fitted into the sleeve 4b for upward and downward movement, and the pin terminal portion 5a is allowed to project downwardly from the lower opening portion of the sleeve 4b.

The spring 7, which is of the coil type, is loaded within the sleeve 4b in its biased fashion so that the spring 7 is interposed between the upper and lower pin terminals 4 and 5. Owing to the foregoing arrangement, the upper pin terminal 4 and the lower pin terminal 5 are biased upwardly and downwardly respectively so as to be resiliently connected with each other by reaction of the biasing force of the spring 7.

At that time, the lower pin terminal 5 is prevented from disengagement by a lower stepped-portion 9 of the fitting portion 5b being engaged with an inner surface of a stepped-portion 8 which is formed by reducing the diameter of the lower end of the sleeve 4b or by any other suitable means. In this way, the resilient connection between the upper pin terminal 4 and the lower pin terminal 5 can be maintained by t@m spring 7.

The contact pin 1, which is resiliently connected in the manner as mentioned above, is held in the hole 3 formed in the insulative substrate 2 such that the contact pin 1 can be freely moved a predetermined stroke in a pressure contact direction (upward and downward direction).

The hole 3 is provided at upper and lower ends thereof respectively with reduced diameter hole portions 3a and 3b connected coaxially with each other. Art shown in FIG. 1, a pin terminal portion 4a of the upper pin terminal portion 4 is inserted into the upper reduced diameter hole portion 3a and a pin terminal portion 5a of the lower pin terminal 5 is inserted into the lower reduced diameter portion 3b such that the pin terminal portion 5a projects downwardly.

Upward and downward free movement strokes of the contact pin 1, which consists of the upper and lower pin terminals 4 and 5 which are resiliently connected with each other, are established by an upper movement preventive element and a lower movement preventive element which are formed between an inner wall of the hole 3 and the contact pin 1.

As a concrete means for setting such upward and downward free movement strokes, an annular stepped-portion 11 formed at a connecting portion between the hole 3 and its upper reduced diameter hole portion 3a and an annular stepped portion 12 formed at a connecting portion between the upper end of the sleeve 4b and the pin terminal portion 4a are connected to each other to form the upward movement preventive element. Furthermore, an annular stepped portion 13 formed on the connecting portion between the enlarged diameter hole 3 and a lower reduced diameter hole portion 3b is engaged with the annular stepped portion 8 formed on a lower end of the sleeve portion 4b to form the lower movement preventive element, so that the overall contact pin 1 can freely move upwardly and downwardly under a combined resilient force.

The insulative substrate 2 is of a two-part construction consisting of an upper substrate 2a and a lower substrate 2b which vertical divide the holes 3. Owing to this structural arrangement, the contact pin 1 can freely be removed from the hole 3 or inserted again into the hole 3 with ease.

As shown in FIG. 1, in the state where a wiring substrate 14 as a lower connection object is not contacted under pressure, the contact pin 1 of the connector is lowered by its gravity or dead weight and kept its lower position by the above-mentioned downward movement preventive element.

Figure 2:
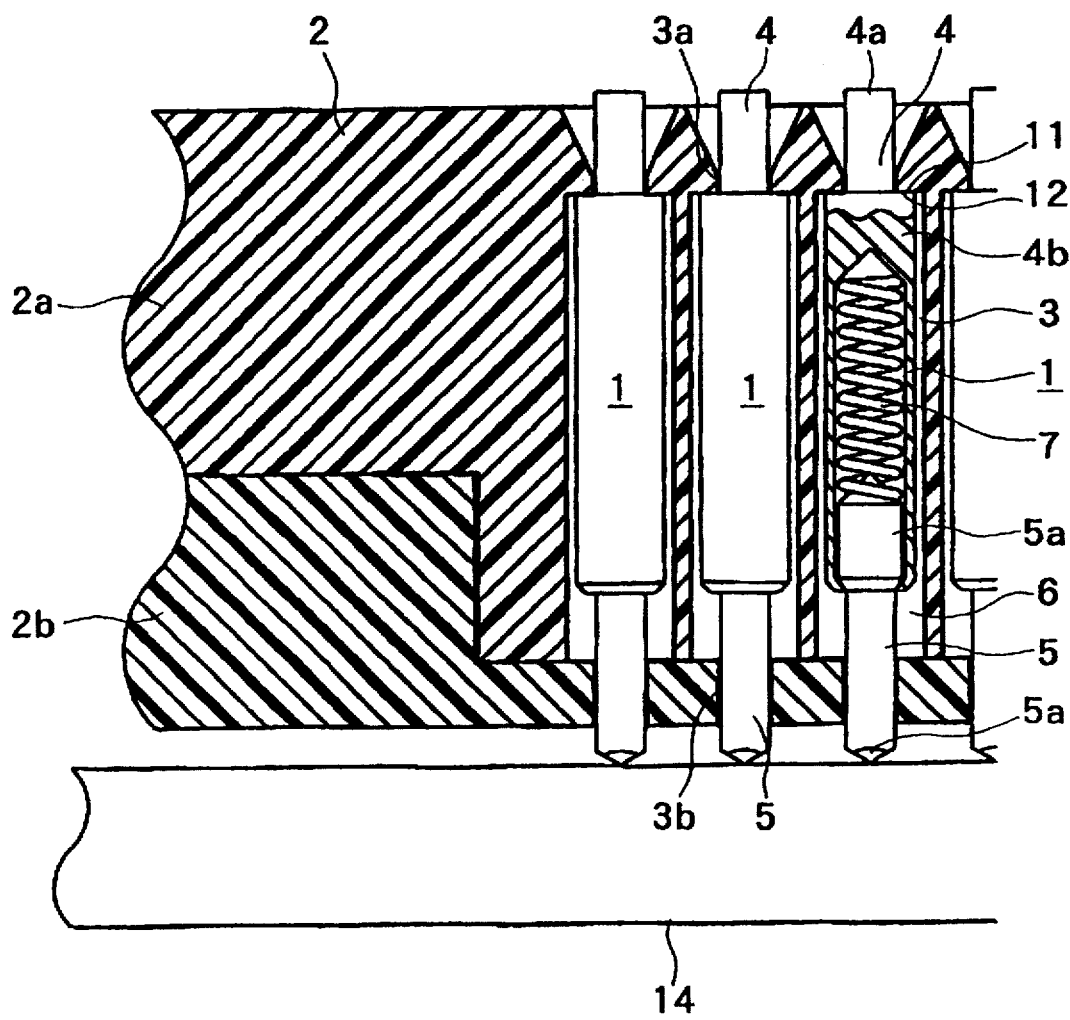
FIG. 2 is a sectional view showing an initial state in which the wiring substrate is in abutment with the lower pin terminal of the connector.

As shown in FIG. 2, by placing the connector on the wiring board 14, the lower pin terminal 5 is brought into abutment with a contact piece formed on a surface of the wiring board 14 as the lower connection object. As a consequence, the lower pin terminal 5 is pushed upwardly so that the overall contact pin 1 can freely move upwardly without biasing the spring 7 and a gap 6 is formed at a lower part of the hole 3 when the contact pin 1 is butted against the upward movement preventive element.

Figure 3:
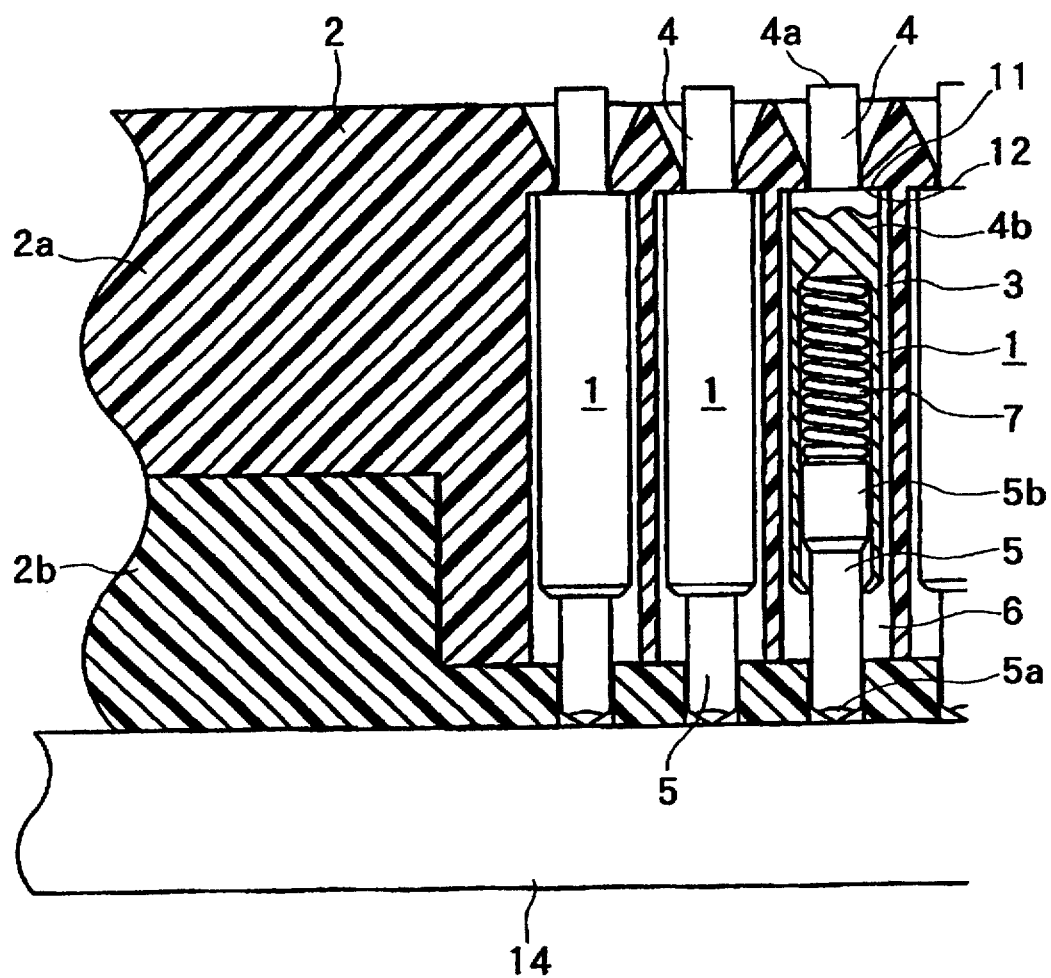
FIG. 3 is a sectional view of a connector showing a last stage in which the wiring substrate is brought into abutment with the lower pin terminal from the state of FIG. 2.

Further, as shown in FIG. 3, after the contact pin 1 is abutted against the upward movement preventive element, the lower pin terminal 5 is continuously pressed by the wiring substrate 14 and slightly moved upwardly while biasing the spring 7. Then, by reaction of this spring 7, a lower end of the lower pin terminal 5, i.e., the lower end of the pin terminal portion 5a is preliminarily contacted under pressure with a circuit pattern of the wiring substrate 14. Then, with a small limited resilient force of the spring 7 and a small abutment stroke against the resilient force, the insulative substrate 2 forming the connector is secured to the wiring substrate 14 by screws or the like, thereby retaining a preliminary pressure contact state of the lower pin terminal 5.

Figure 4:
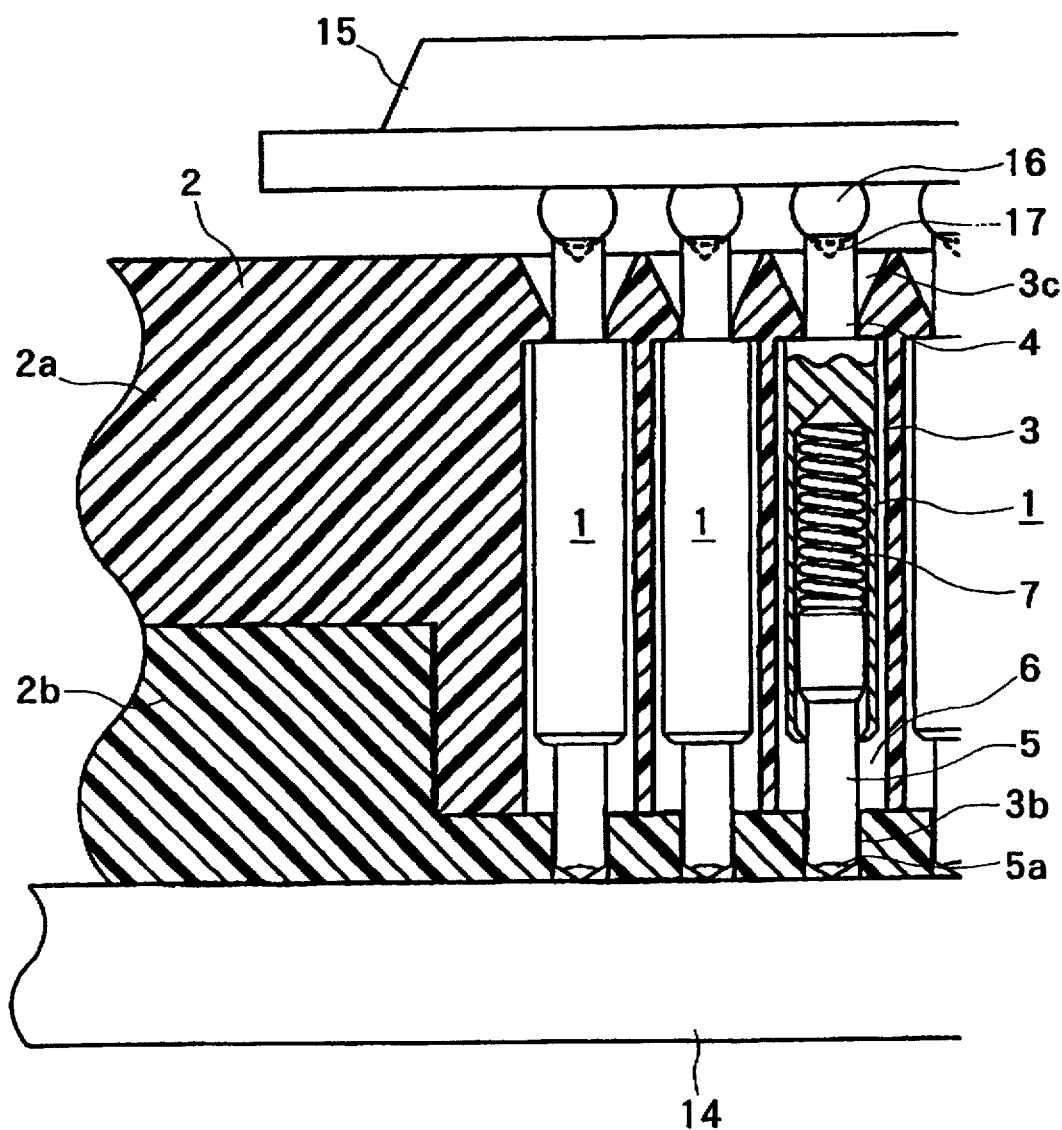
FIG. 4 is a sectional view of a connector showing an initial stage in which a connection object is placed on the upper pin terminal in the state of FIG. 3.

In such a state as just mentioned, as shown in FIG. 4, an upper connection object such as an IC 15 or a wiring substrate is placed on the upper surface of the insulative substrate 2. The IC 15 has a number of contact pieces, for example, spherical bumps 16 on its lower surface. In an early stage of the upper connection object being placed on the upper surface of the insulative substrate 2 as shown in FIG. 4, the bumps 16 are held on the upper end of the upper pin terminal 4 by the weight of the IC 15.

Figure 5:
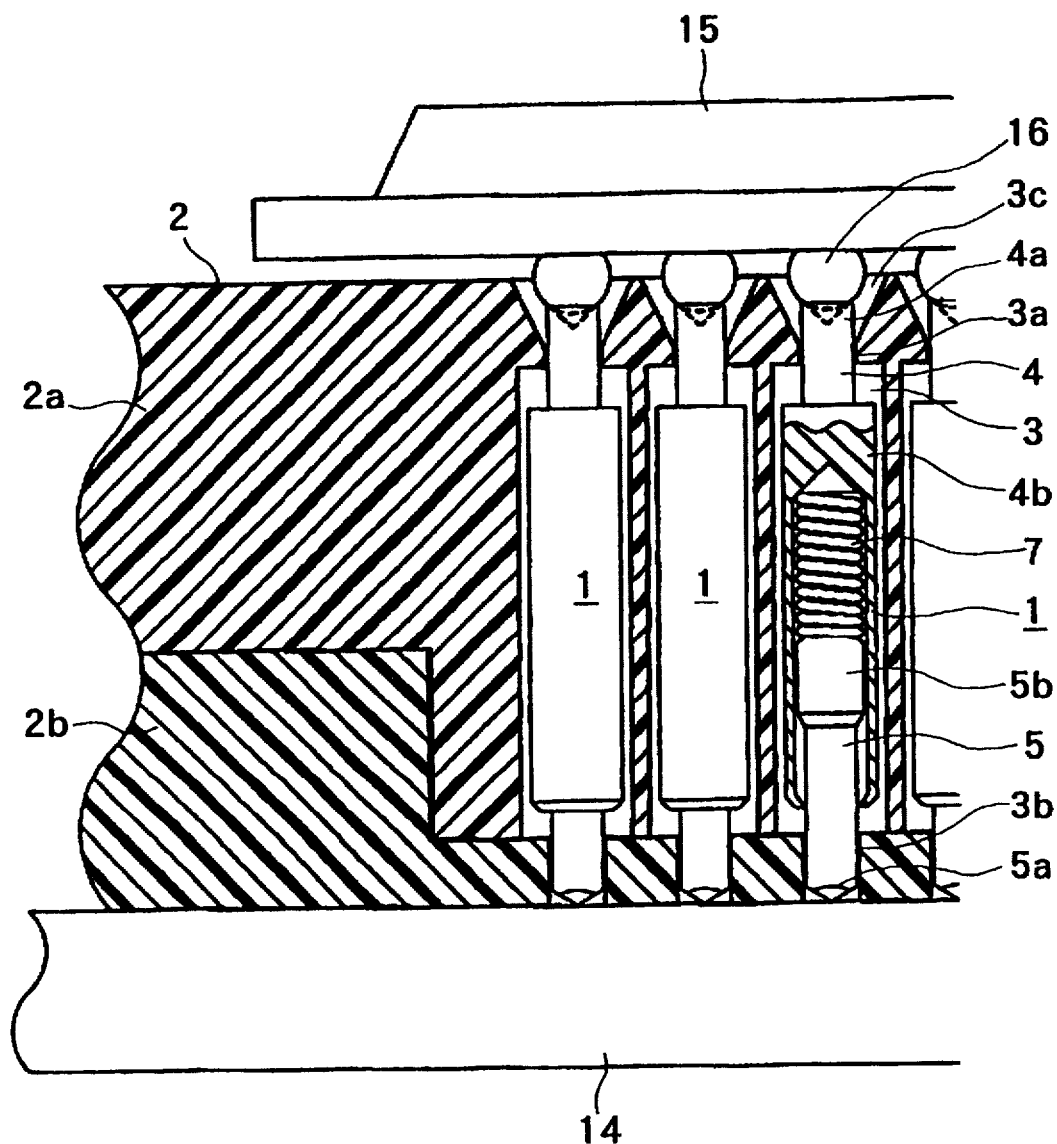
FIG. 5 is a sectional view of a connector showing a last state in which a connection object is brought into abutment with the upper pin terminal from the state of FIG. 4.

As shown in FIG. 5, when the IC 15 is lowered from the above state, each of the bumps 16 pushes down a corresponding upper pin terminal 4. As a consequence, the upper pin terminal 4 is moved downwardly together with the bump 4 while biasing or compressing the spring 7. By reaction of the spring 7, a push-up force is applied to the upper pin terminal 4 so that the upper end of the pin terminal 4, i.e., the upper end of the pin terminal portion 4a is contacted under pressure with the bump 16 of the IC 15. This causes the lower pin terminal 5 to be contacted under a larger resilient force with the surface of the wiring substrate 14.

That is, in the state in which the wiring substrate 14 is contacted under pressure with the lower pin terminal 5 and the spring 7 is slightly biased or compressed, a preliminary resilient force (preload) is accumulated in the upper pin terminal 4 by the reaction of the spring 7. Thus, when the IC 15 is contacted under pressure with this upper pin terminal 4, a stronger vertical pressure contact force can be obtained.

Each spherical bump 16, while being received in a dilated hole portion 3c continuous with an upper portion of the upper reduced diameter hole portion 3a, is contacted under pressure with the upper end of the upper pin terminal 4. The upper end of the upper pin terminal 4 is provided with a conical recess 17.

Figure 8:
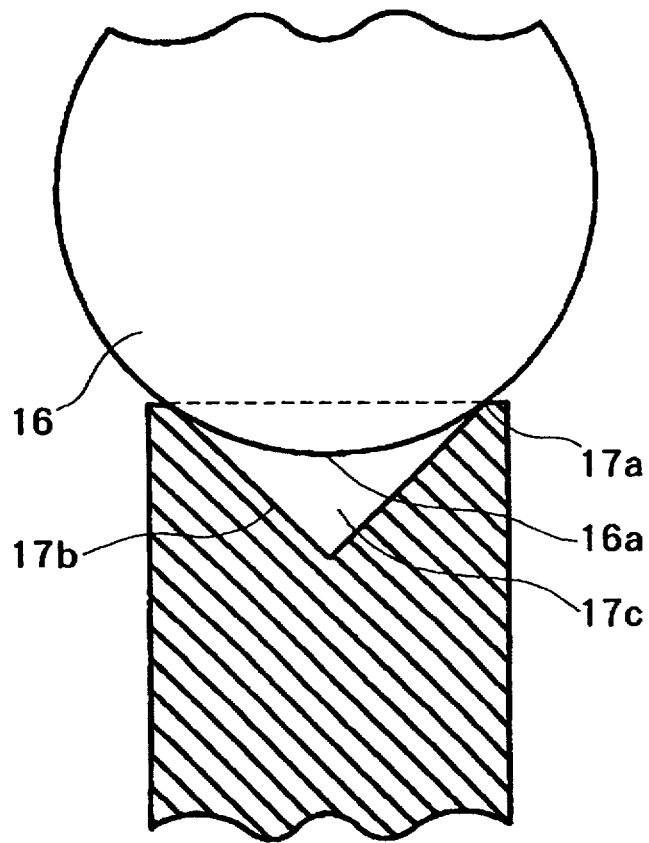
FIG. 8 is an enlarged sectional view showing a contacted state of the spherical bump of the IC with the upper pin terminals.

As shown in FIG. 8, the spherical bump 16 is abutted with the upper pin terminal 4 such that an external region of a lower dead point portion 16a abuts with and is supported by an annular edge portion 17a of an upper end of an inclined surface of the recess 17, and a release space 17c is formed between the lower dead point portion 16a of the spherical bump 16 and an inner bottom surface 17b of the recess 17 so that a non-contact state is realized.

As shown in FIG. 4, when the wiring substrate 14 is contacted under pressure with the lower pin terminal 5, the lower pin terminal 5 is inserted into the hole 3, i.e., the lower reduced diameter hole portion 3b, such that the connector is superimposed on the wiring substrate. As shown in FIG. 4, the upper pin terminal 4 is allowed to project upwardly of the upper end of the upper reduced diameter portion 3a, i.e., upwardly of the upper end of the enlarged diameter hole portion 3 at that time. The bump 16 of the IC 15 is placed on the projected end of the upper pin terminal 4. By pressing the IC 15 down from that position, the upper pin terminal 4 inserted into the hole is contacted under pressure with the bump 16.

The above-mentioned IC 15 is of the BGA type which has a number of spherical bumps 16 on its lower surface. Besides this, a leadless type IC, which has a planar conductive pad intimately attached to a lower surface of an IC is likewise applicable for use with the connector of the present invention. In the manner mentioned above, the connector is interposed between the wiring substrate 14 and the IC 15, or between the wiring substrates, though not shown, so that the two can be contacted with each other under pressure.

It has been described above and shown in FIGS. 1 through 5 that the sleeve 4b is integrally connected to the pin terminal portion 4a to form the pin terminal 4. To the contrary, it is also possible for the sleeve 4b to be integrally connected to the pin terminal portion 5a of the lower pin terminal 5.

That is, the state shown in FIG. 1 can be inverted such that the lower pin terminal 5 serves as the upper pin terminal and the upper pin terminal 4 serves as the lower pin terminal, and then an enlarged diameter sleeve is integrally connected to the upper end of the pin terminal portion 5a of the reduced diameter lower pin terminal, so that the upper pin terminal 4 is vertically fitted into the interior of the opening of the upper end of the sleeve. In this case, that part corresponding to the enlarged diameter fitting portion 5b is provided on the lower end of the upper pin terminal 4, while that portion corresponding to the reduced diameter pin terminal portion 5a is provided on the upper end of the portion corresponding to the fitting portion 5b.

Figure 6:
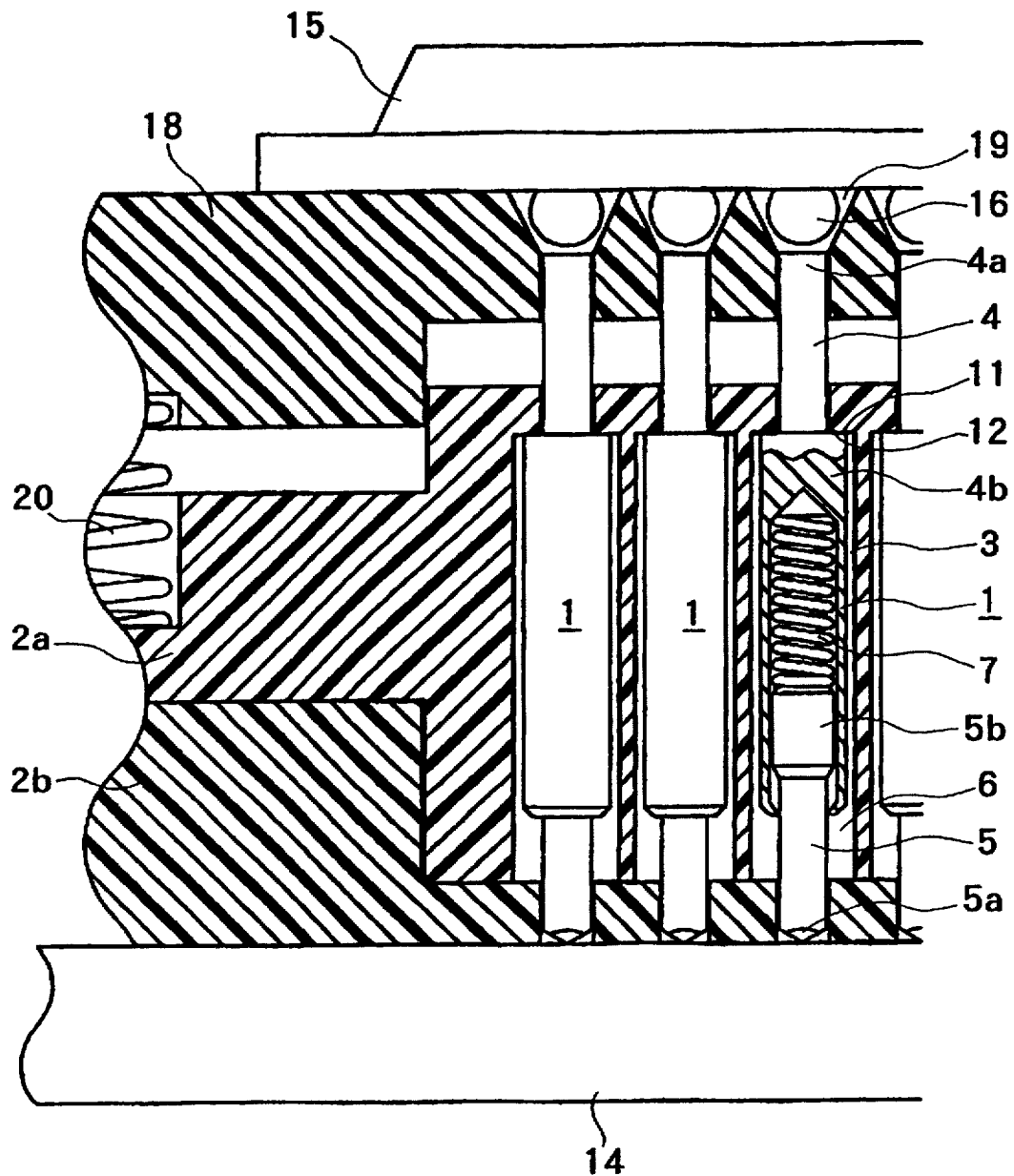
FIG. 6 is a sectional view of another example of a connector of this invention showing a state in which the wiring substrate is contacted under pressure with the lower pin terminal.
Figure 7:
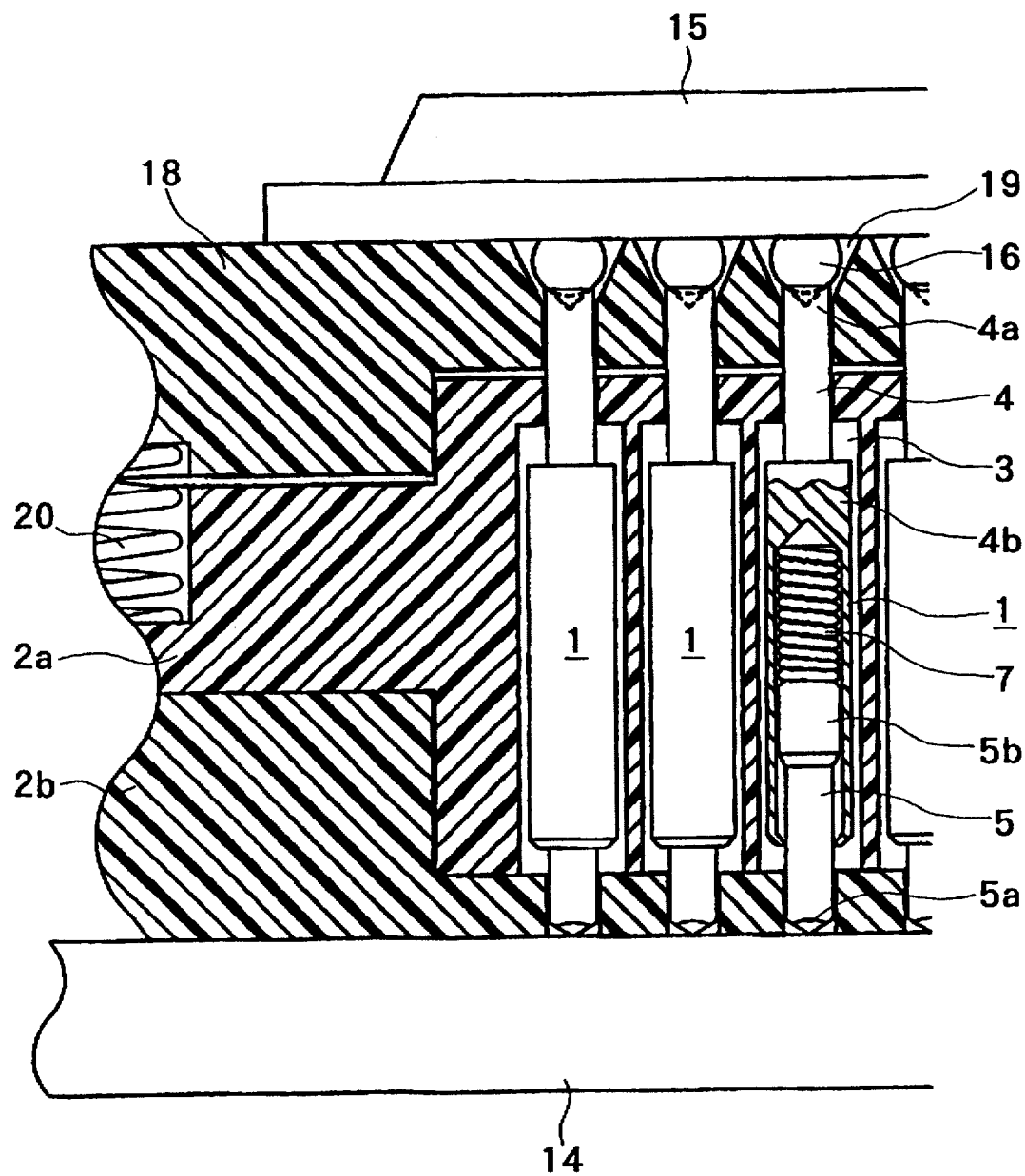
FIG. 7 is a sectional view of a connector showing a state in which a connection object is contacted under pressure with the upper pin terminal of FIG. 6.

Second Embodiment (FIGS. 6 and 7)

In this embodiment, the connector is provided with an IC mounting plate 18.

As shown in FIG. 6, an IC 15 is placed on the IC mounting plate 18 such that a lower surface of the IC 15 is supported on the upper surface of the mounting plate 18. Holes 19 for receiving the bumps 16 arranged on the lower surface of the IC are formed in the mounting plate 18, and upper ends of the pin terminal portions 4a of the upper pin terminals 4 are inserted from the open lower ends of the holes 19 so as to face the bumps 16. From that state as shown in FIG. 7, the IC 15 is lowered together with the mounting plate 18, to thereby cause the pin terminal portions 4a of the upper pin terminals 4 to protrude upwardly through the holes 19 so as to be contacted under pressure with the bumps 16, respectively. That is, by lowering the IC 15 and the mounting plate 18 together, each bump 16 presses the corresponding upper pin terminal 4 downwardly against the spring 7 and the upper pin terminal 4 is caused to contact the bump 16 under pressure against the reaction of the spring 7.

The IC mounting plate 18 is supported in a levitated (separated) state above the upper surface of the connector by a spring 20, and the mounting plate 18 and the IC 15 are lowered against the spring 20.

When the lower pin terminals are brought into abutment with the contact pieces of the surface of the wiring substrate in the connector, the overall contact pin is moved upwardly with no-load thereagainst, and a small preload is accumulated during a small portion at the end of the upward stroke. Accordingly, the connector is simply placed on the wiring substrate and fastened by machine screws with ease, thereby enabling an easy mounting operation.

In addition, when the upper connection object such as an IC or the like is not contacted under pressure with the upper pin terminal, the pressure against the wiring substrate is small, unlike the prior art in which a large resilient force by the spring is applied only to the wiring substrate as the lower connection object. Therefore, various problems of the prior art, such as warping or turning up of the wiring substrate which results in a decrease in contact pressure of the lower pin terminal, cracks of the substrate, and the like can be effectively avoided.

According to the present invention, a limited amount of preload can be applied to the terminal when the lower pin terminal is pushed up by the wiring substrate as a lower connection object, the upper position (standby position) of the upper pin terminal can properly be established, and by pushing up the lower pin terminal to form a space in a lower portion of the hole, the upper pin terminal can properly be pushed down within an allowable range of this space to increase the vertical resilient force, thereby providing a reliable contact pressure against the upper and lower connection objects.

The upper pin terminal and the lower pin terminal are resiliently joined or combined under the biasing force of the coil spring in which resilient force is stored. The upper and lower pin terminals can be freely moved a predetermined stroke within the hole while reliably maintaining the maximum expanded state substantially as one part. In this manner, a pressure contact with the connection object can be uniformly started and a uniform contact pressure can be obtained.

Also, owing to the arrangement in which the contact pin can be freely moved by a predetermined vertical stroke and the upper and lower pin terminals are resiliently held while compressing the coil spring such that the upper and lower pin terminals can, move upwardly and downwardly in a manner independent of each other, the pressure contact force by the upper and lower pin terminals can be adequately adjusted by establishing the upward and downward free stroke.

In addition, the connector of the present invention does not suffer from difficulty in removing the contact pin after the contact pin has been inserted under pressure into the insulative substrate, as is the case with prior art press-fit arrangements. Rather the contact pin can easily be exchanged.

What is claimed is:

1. A connector for electrically connecting an upper connection object with a lower connection object, said connector comprising:

an insulative substrate having a hole formed therethrough;

a contact pin mounted in said hole of said insulative substrate, said contact pin comprising an upper terminal pin, a lower terminal pin axially movably secured to said upper terminal pin such that said lower terminal pin is axially movable relative to said upper terminal pin, and a spring interposed between said upper terminal pin and said lower terminal pin; and wherein said contact pin is axially movably mounted in said hole of said insulative substrate such that said upper terminal pin, said lower terminal pin and said spring are axially movable together as a unit relative to said insulative substrate.

2. A connector as recited in claim 1, further comprising an upward movement preventive element provided on said insulative substrate and protruding radially into said hole to define an upper limit of axial movement of said contact pin relative to said insulative substrate; and a downward movement preventive element provided on said insulative substrate and protruding radially into said hole to define a lower limit of axial movement of said contact pin relative to said insulative substrate.

3. A connector as recited in claim 1, wherein said contact pin further comprises an enlarged diameter cylindrical portion between said upper terminal pin and said lower terminal pin; and said enlarged diameter cylindrical portion has a diameter larger than diameters of said upper terminal pin and said lower terminal pin, respectively, so as to form an upper annular stepped portion between said upper terminal pin and said enlarged diameter cylindrical portion and a lower annular stepped portion between said lower terminal pin and said enlarged diameter cylindrical portion.

4. A connector as recited in claim 3, further comprising an upward movement preventive element provided on said insulative substrate and protruding radially into said hole, said upward movement preventive element being engageable with said upper annular stepped portion; and a downward movement preventive element provided on said insulative substrate and protruding radially into said hole, said downward movement preventive element being engageable with said lower annular stepped portion.

5. A connector as recited in claim 4, wherein said enlarged diameter cylindrical portion of said contact pin comprises a cylindrical sleeve portion; and said spring is disposed in said cylindrical sleeve portion of said contact pin.

6. A connector as recited in claim 5, wherein one of said upper and lower terminal pins is fixed to a first end of said cylindrical sleeve portion;

the other of said upper and lower terminal pins is axially movably secured to a second end of said cylindrical sleeve portion; and said spring is axially interposed between said cylindrical sleeve portion and said other of said upper and lower terminal pins to bias said other of said upper and lower terminal pins away from said one of said upper and lower terminal pins.

7. A connector as recited in claim 1, wherein said contact pin further comprises a cylindrical sleeve portion between said upper terminal pin and said lower terminal pin; and said spring is disposed in said cylindrical sleeve portion of said contact pin.

8. A connector as recited in claim 7, wherein one of said upper and lower terminal pins is fixed to a first end of said cylindrical sleeve portion;

the other of said upper and lower terminal pins is axially movably secured to a second end of said cylindrical sleeve portion; and said spring is axially interposed between said cylindrical sleeve portion and said other of said upper and lower terminal pins to bias said other of said upper and lower terminal pins away from said one of said upper and lower terminal pins.

9. A connector as recited in claim 8, wherein said first end of said cylindrical sleeve portion comprises a closed end, and said second end of said cylindrical sleeve portion comprises an open end having a radially inwardly stepped portion;

said other of said upper and lower terminal pins comprises a pin portion, a fitting portion having a diameter greater than said pin portion, and a stepped portion between said pin portion and said fitting portion; and said fitting portion is disposed in said cylindrical sleeve portion and said pin portion extends out of said cylindrical sleeve portion through said open end thereof, such that said stepped portion of said other of said upper and lower terminal pins is engageable with said radially inwardly stepped portion of said cylindrical sleeve portion for maintaining said fitting portion of said other of said upper and lower terminal pins in said cylindrical sleeve portion.

10. A connector for electrically connecting an upper connection object with a lower connection object, said connector comprising:

an insulative substrate having a hole formed therethrough;

a contact pin mounted in said hole of said insulative substrate, said contact pin comprising an upper terminal pin, a lower terminal pin, a cylindrical sleeve portion having a first end fixed to one of said upper and lower terminal pins and a second end axially movably secured to the other of said upper and lower terminal pins, and a spring interposed between said cylindrical sleeve portion and said other of said upper and lower terminal pins and biasing said other of said upper and lower terminal pins away from said one of said upper and lower terminal pins;

an upward movement preventive element protruding radially inwardly from said insulative substrate into said hole and defining an upward movement limit of said cylindrical sleeve portion, said upper terminal pin projecting upwardly beyond said upward movement preventive element;

a downward movement preventive element protruding radially inwardly from said insulative substrate into said hole and defining a downward movement limit of said cylindrical sleeve portion, said lower terminal pin projecting downwardly beyond said downward movement preventive element; and wherein an axial distance between said upward and downward movement preventive elements is greater than a length of said cylindrical sleeve portion, such that said upper and lower terminal pins, said cylindrical sleeve portion and said spring are axially movable together as a unit in said hole relative to said insulative substrate.

11. A connector as recited in claim 10, wherein said spring is mounted in said cylindrical sleeve portion.

12. A connector as recited in claim 11, wherein said first end of said cylindrical sleeve portion comprises a closed end, and said second end of said cylindrical sleeve portion comprises an open end having a radially inwardly stepped portion;

said other of said upper and lower terminal pins comprises a pin portion, a fitting portion having a diameter greater than said pin portion, and a stepped portion between said pin portion and said fitting portion; and said fitting portion is disposed in said cylindrical sleeve portion and said pin portion extends out of said cylindrical sleeve portion through said open end thereof, such that said stepped portion of said other of said upper and lower terminal pins is engageable with said radially inwardly stepped portion of said cylindrical sleeve portion for maintaining said fitting portion of said other of said upper and lower terminal pins in said cylindrical sleeve portion.

* * * * *